United States Patent
Yu et al.

(10) Patent No.: US 8,694,943 B1
(45) Date of Patent: Apr. 8, 2014

(54) METHODS, SYSTEMS, AND COMPUTER PROGRAM PRODUCT FOR IMPLEMENTING ELECTRONIC DESIGNS WITH CONNECTIVITY AND CONSTRAINT AWARENESS

(75) Inventors: Henry Yu, Palo Alto, CA (US); Roland Ruehl, San Carlos, CA (US); Elias L. Fallon, Allison Park, PA (US); Regis Colwell, Gibsonia, PA (US); Joshua Baudhuin, Portland, OR (US); Hui Xu, Wexford, PA (US); Harsh Deshmane, Sunnyvale, CA (US); Yinnie Lee, Campbell, CA (US); Simon Simonian, San Jose, CA (US); Harindranath Parameswaran, Uttar Pradesh (IN); Pardeep Juneja, Delhi (IN); Anjna Khanna, Delhi (IN); Sanjib Ghosh, Uttar Pradesh (IN); Timothy Rosek, Gibsonia, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/445,874

(22) Filed: Apr. 12, 2012

Related U.S. Application Data

(60) Provisional application No. 61/582,224, filed on Dec. 30, 2011.

(51) Int. Cl.
   *G06F 17/50* (2006.01)
(52) U.S. Cl.
   USPC ......................................................... 716/123
(58) Field of Classification Search
   USPC ......................................................... 716/123
   See application file for complete search history.

(56) References Cited

U.S. PATENT DOCUMENTS

| | | | |
|---|---|---|---|
| 8,028,259 B2* | 9/2011 | Phan Vogel | 716/111 |
| 8,176,445 B1 | 5/2012 | Qian | |
| 8,381,153 B2 | 2/2013 | Chiang et al. | |
| 8,397,194 B2 | 3/2013 | Uppaluri et al. | |
| 8,516,404 B1 | 8/2013 | Cao et al. | |
| 2003/0229860 A1 | 12/2003 | Li | |
| 2004/0068708 A1* | 4/2004 | Sivaraman et al. | 716/10 |
| 2005/0221201 A1 | 10/2005 | Ellis | |

(Continued)

OTHER PUBLICATIONS

Notice of Allowance dated Sep. 19, 2013 for U.S. Appl. No. 13/445,874.

(Continued)

*Primary Examiner* — Vuthe Siek
*Assistant Examiner* — Mohammed Alam
(74) *Attorney, Agent, or Firm* — Vista IP Law Group, LLP

(57) ABSTRACT

Disclosed are methods and systems for implementing constraint and connectivity aware physical designs. The method or system provides a connectivity-aware environment to implement electronic designs. For example, the method interactively determines whether an electronic design complies with various constraints by using connectivity information in a nearly real-time manner while the electronic design is being created in some embodiments. The method or system uses the connectivity information provided by a connectivity engine or specified by designers to present feedback to a user as to whether a newly created object or a newly modified object complies or violates certain relevant constraints in an interactive manner or in nearly real-time without having to perform such constraints checking in batch mode. The method further enables one to implement electronic designs by using connectivity information without performing extraction on layouts or rebuilding nets.

42 Claims, 10 Drawing Sheets

(56) References Cited

U.S. PATENT DOCUMENTS

| | | |
|---|---|---|
| 2005/0268258 A1 | 12/2005 | Decker |
| 2006/0200789 A1 | 9/2006 | Rittman |
| 2006/0259882 A1 | 11/2006 | Lin et al. |
| 2007/0148794 A1* | 6/2007 | Cha et al. .................. 438/14 |
| 2008/0005713 A1 | 1/2008 | Singh et al. |
| 2008/0178140 A1 | 7/2008 | Lin et al. |
| 2008/0184183 A1 | 7/2008 | Kobayashi |
| 2008/0250361 A1 | 10/2008 | Bae et al. |
| 2009/0031264 A1* | 1/2009 | Rittman et al. ............... 716/5 |
| 2009/0037852 A1 | 2/2009 | Kobayashi et al. |
| 2009/0083689 A1* | 3/2009 | Ringe et al. ................ 716/12 |
| 2009/0150850 A1 | 6/2009 | Sinha et al. |
| 2009/0254814 A1 | 10/2009 | Lai et al. |
| 2009/0276735 A1 | 11/2009 | Kramer et al. |
| 2009/0313596 A1 | 12/2009 | Lippmann et al. |
| 2010/0162151 A1 | 6/2010 | Class et al. |
| 2010/0229140 A1 | 9/2010 | Strolenberg et al. |
| 2010/0257498 A1 | 10/2010 | Alpert et al. |
| 2011/0219341 A1 | 9/2011 | Cao et al. |
| 2012/0023468 A1* | 1/2012 | Fischer et al. ............. 716/112 |
| 2012/0023470 A1 | 1/2012 | Nakagawa |
| 2012/0023471 A1 | 1/2012 | Fischer et al. |
| 2012/0185811 A1 | 7/2012 | Ramachandran et al. |
| 2012/0254818 A1 | 10/2012 | Liu et al. |
| 2013/0031521 A1 | 1/2013 | Teoh |
| 2013/0086542 A1 | 4/2013 | Teoh et al. |

OTHER PUBLICATIONS

Amendment After Non-Final Rejection dated Jul. 5, 2013, for U.S. Appl. No. 13/445,847.
Amendment After Non-Final Rejection dated Apr. 16, 2013, for U.S. Appl. No. 13/445,860.
Non-Final Office Action dated Jan. 3, 2013 for U.S. Appl. No. 13/445,832.
Non-Final Office Action dated Apr. 5, 2013 for U.S. Appl. No. 13/445,847.
Notice of Allowance dated Jun. 5, 2013 for U.S. Appl. No. 13/445,832.
Final Office Action dated Jun. 14, 2013, for U.S. Appl. No. 13/445,860.
Non-Final Office Action dated Jan. 16, 2013 for U.S. Appl. No. 13/445,860.

* cited by examiner

METHODS, SYSTEMS, AND COMPUTER PROGRAM PRODUCT FOR IMPLEMENTING ELECTRONIC DESIGNS WITH CONNECTIVITY AND CONSTRAINT AWARENESS

CROSS-REFERENCE TO RELATED APPLICATION(S)

This application claims the benefit of U.S. Provisional Patent App. Ser. No. 61/582,224, filed on Dec. 30, 2011 and entitled "METHODS, SYSTEMS, AND COMPUTER PROGRAM PRODUCT FOR IMPLEMENTING ELECTRONIC DESIGNS WITH CONNECTIVITY AND CONSTRAINT AWARENESS". The content of the U.S. Provisional Patent Application is hereby expressly incorporated by reference in its entirety for all purposes.

This application is cross-related to U.S. patent application Ser. No. 13/445,832, filed concurrently with the title "METHODS, SYSTEMS, AND ARTICLES OF MANUFACTURE FOR IMPLEMENTING A PHYSICAL DESIGN OF AN ELECTRONIC CIRCUIT WITH AUTOMATIC SNAPPING", U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", and U.S. patent application Ser. No. 13/445,874, filed concurrently with the title "METHODS, SYSTEMS, AND ARTICLES OF MANUFACTURE FOR IMPLEMENTING INTERACTIVE COLORING OF PHYSICAL DESIGN COMPONENTS IN A PHYSICAL ELECTRONIC DESIGN WITH MULTIPLE-PATTERNING TECHNIQUES AWARENESS". The content of the aforementioned applications is hereby expressly incorporated by reference in its entirety for all purposes.

BACKGROUND

Conventional electronic design process proceeds sequentially through a schematic design stage to determine the schematic design of an electronic design, a physical design stage to construct the layout of the electronic design, and a verification stage at which various verification processes, such as design rule checking and physical verification, are performed to determine whether the electronic design complies with certain set of constraints, design rules, requirements, or goals (collectively constraints.) Nonetheless, any violations identified during the verification stage may require a costly and often time-consuming process to resolve such violations. For example, a layout designer may have to return to the physical design to move certain shapes or to reroute certain interconnects in order to satisfy a spacing constraint and re-submit the revised electronic design to the verification modules or design rule check engines to determine whether the revised electronic design satisfies the prescribed constraints or design rules. As a result, the electronic design process may involve an iterative process where designers loop among various stages of the process, hoping that the electronic design may be finally signed off for tapeout. In addition, a layout designer often does not know whether any portion of the layout violates certain constraints until the layout is complete and ready for verification. The advent of more complex design rules simply exacerbates the problems.

The recent advances in very deep sub-micron (VDSM) integrated circuits (ICs) have exacerbated the issues in the physical design methodology process of electronic circuits. For example, most conventional electronic circuit design tools focus on post-layout verification of the power grid or interconnects when the entire chip design is complete and detailed information about the parasitics of the physical designs and the currents drawn by the transistors are known. In these conventional approaches, the conventional circuit synthesis step is followed by layout synthesis and each step is carried out independent of the other. This is again followed by a physical or formal verification step upon the completion of the entire physical layout to check whether the desired performance goals have been achieved after layout generation and extraction. These steps are carried out iteratively in the conventional approaches till the desired performance goals are met. Nonetheless, such an iterative approach wastes significant amount of resources because various physical design tools, such as the placement tool, the router, etc., and various schematic design tools, such as the schematic editor, the schematic level simulator(s), etc., are unaware of the electrical parasitics associated with the physical data of the design and the electrical characteristics associated with the electrical parasitics.

Therefore, there exists a need for providing a method, a system, and an article of manufacture for implementing physical electronic designs with connectivity and constraint awareness.

SUMMARY

Disclosed are a computer-implemented method and a system for implementing constraint and connectivity aware physical designs. At the top level of the flow, the method or system provides various modules and performs various processes to provide a connectivity-aware environment to implement electronic designs. For example, the method or system may interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in an interactive manner or in nearly real-time without having to perform such constraints checking in batch mode.

In these embodiments, the method or system creates one or more classes for the nets in the electronic design and formulate each at least net of the nets as an object of a particular class and store the at least one net accordingly. By treating a net as an object, these embodiments may associate various entities, such as one or more constraints, with the net. When an object, such as a geometric shape in a layout, is being created in the physical design, the method or the system further associates the object with a net, which also constitutes an object, and stores both the object and its associated net in a design database and thus provide the connectivity information for the object at the time the object is created in the electronic design. In other words, these embodiments no longer treat a net as a list of objects. Rather, these embodiments treat the net as an object that includes or is associated with one or more geometric shapes in the net to provide the connectivity information.

In addition or in the alternative, some embodiments identify a plurality of sets of one or more constraints that may be applied to a specific object in an electronic design. Rather than running through all the constraints in the plurality of sets, the method or system identifies one or more relevant constraints from the plurality of sets and applies only the identified one or more relevant constraints to the object. In some embodiments where an electronic design comprises a first net associated with one or more first sets of constraints and a second net associated with one or more second sets of constraints, the disclosed method or system may identify one a subset of one or more constraints from the one or more first sets and the one or more second sets and apply only the subset of one or more constraints to the first net and the second net for constraint checking purposes. The method or system may then present the constraint checking results to a user in an interactive manner while the user is creating or modifying one or both nets or a part thereof.

For example, if an electronic design includes a first net associated with one or more first sets of voltage-based constraints that impose different spacing requirements between the first net and other net(s) based on the operating voltages in the first net and a second net associated with one or more second sets of voltage-based constraints that also impose different spacing requirements between the second net and other net(s) based on the operating voltages in the second net, the method may identify, for example, a first constraint from the one or more first sets that represents the worst-case scenario for the first net and a second constraint from the one or more second sets that also represents the worst-case scenario for the second net. The method may then apply only the first constraint and the second constraint to the first net and the second net and determine whether the first net and the second net as currently designed satisfy these two constraints and provide the constraint checking results to the designer in an interactive, nearly real-time manner.

In these embodiments, the method or system needs not extract the corresponding objects to rebuild these nets of interest in the physical design to further identify the connectivity information for the constraint checking. Rather, the connectivity information for all the objects belonging to these nets of interest has been identified at the time(s) when these objects were created in the physical design for the first time. Therefore, the method or system may perform the connectivity-based constraint checks by using whatever information or data, which already exists in one or more design databases, without performing identifying a list of objects for a net, extracting the objects, and rebuilding the net for constraint checking purposes. In some embodiments, the method or system allows a user to identify a smaller subset of constraints from one or more larger sets of constraints that may apply to an object in the design and applies only the smaller subset of constraints to the object during constraint checking without having to running through all the constraints in the one or more larger sets of constraints. In these embodiments, a user may overload the system by specifying which constraints to use, for example, at a given point in time on any object in the electronic design, and the method or the system checks the object of interest against such specified constraints.

Some embodiments bind a schematic design view with a physical design view in order to show both the forward annotation and backward annotation in both the schematic design session and the physical design session. In these embodiments, the method or system may show, for example, some constraint checking results in the schematic view through backward annotation while a designer is manipulating the physical design view that gives rise to the constraint checking results. In addition or in the alternative, the method or system may also present any changes and their respective constraint checking results (if any) in the physical design view through forward annotations while a designer is manipulating the schematic view of the electronic design. By binding a schematic view and a physical design view of an electronic design, the method or the system may leverage some schematic simulation results or may invoke a schematic simulator to perform some schematic simulations to obtain some electrical data such as currents or voltages at some nodes of interest. The electrical data may further be mapped to the physical design view such that the method or system may use such mapped, electrical data to perform certain constraint checks that require at least some electrical data.

One of the advantages of these embodiments is that the method or system may perform such constraint checks requiring some electrical data even when the layout is incomplete or is being created. The method or system may further identify connectivity information from the connectivity engine or receives user-specified connectivity information assigned by a designer to identify or create one or more shapes belonging to the same net. For a physical object that is being created in a layout, the method or system associates the physical object with the connectivity information which may be either identified from the connectivity engine or provided or assigned by the designer. For example, the method or the system may associate a physical object with the net to which the physical object belongs at the time the physical object is created for the first time in the layout in some embodiments. The method or system also treats a net as an object in the design. In some embodiments, the object that represents a net is generally treated as a discrete entity and may include one or more routines and data as the objects in object-oriented programming. In these embodiments, the method or system may thus associate various other entities, attributes, properties, etc. with a net.

In some embodiments, the method identifies or initiates a physical design session for a physical design of an electronic circuit. In these embodiments, the method or the system needs only a partial layout that comprises merely one component, such as an interconnect wire segment, a via, or a via cluster, to perform its intended functions of implementing electronic circuit design with constraint and connectivity awareness. In other words, some embodiments as described herein do not require a complete physical layout that have gone through the complete placement, global routing, and detail routing stages. That is, the method and system provide the designers with the ability to implement the electronic circuit design with constraint and connectivity awareness from the first component, the first device, or the first net in the physical design without going through costly iterations between the physical design and the post-layout verification design flows.

For example, even if a physical design contains only one geometric shape, and the remainder of the physical design has not been created or completed yet, the method or the system may still determine whether this particular geometric shape meets relevant constraints and whether and what kind of adjustments need to be made to the design to ensure the compliance of the relevant constraints. In these embodiments where the physical design includes only a partial, incomplete layout, the method or the system may use a binder that binds the schematic design and the physical design together and then uses the connectivity information from the schematic design of the electronic design to identify which shapes belong to the partial, incomplete net. In some embodiments, the method or the system may use the extraction module or one or more net tracing modules to identify which shapes belong to a particular net.

In addition or in the alternative to using the connectivity information or the extraction module or one or more net tracing modules, the method or the system may allow the user to input or identify connectivity for one or more geometric shapes. In some embodiments, the method may also receive or identify input from a user or designer to determine which shapes belong to a partial, incomplete net. The method may further identify a set of constraints or design rules for a shape in a net or for a net such as a net-based design rule. The method may then identify one or more relevant constraints or design rules from the set of constraints or design rules for the shape or the net of interest. That is, the method or the system may identify the appropriate constraints or design rules that are pertinent to the geometric shape(s) of interest and perform checks or verification without exhausting the entire rule deck.

The method may then perform checks or verification to determine whether these one or more relevant design rules or constraints are satisfied for the geometric shape of interest or for one or more shapes in the interested net. In these embodiments, the method need not go through and examine all the design rules or constraints in the set of constraints or design rules, much less the entire rule deck. Rather, the method identifies the relevant design rules or constraints based on the interested net or the interested shape. In some embodiments, the method may further provide the results of the checks, hints, or recommendations when at least one of the relevant design rules or constraints is not satisfied for the interested net or the interested shape. In some embodiments, the method or the system may provide the results of the checks, hints, or recommendations while the geometric shape of interest is being created or modified even before violations of some of the design rules or constraints actually occur.

In some embodiments, the method may perform a modification process on the interested net, which may be only a partial, incomplete net. In these embodiments, the method may identify one or more net-based design rules or constraints for the net of interest, perform the modification process (e.g., moving the interested net), and determine whether the one or more net-based design rules or constraints are satisfied between the net of interest and one or more other nets. In some embodiments, the determination of whether the one or more net-based design rules or constraints are satisfied with the modification process applied to the net of interest is performed during the application or performance of the modification process on the net of interest. In these embodiments, the method interactively or in nearly real-time determines whether certain design rules or constraints are satisfied. In some embodiments, the method may further interactively display one or more graphical indicators, one or more textual indicators, or a combination thereof to signify the compliance with or violation of the relevant design rules or constraints.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Over section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Over section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
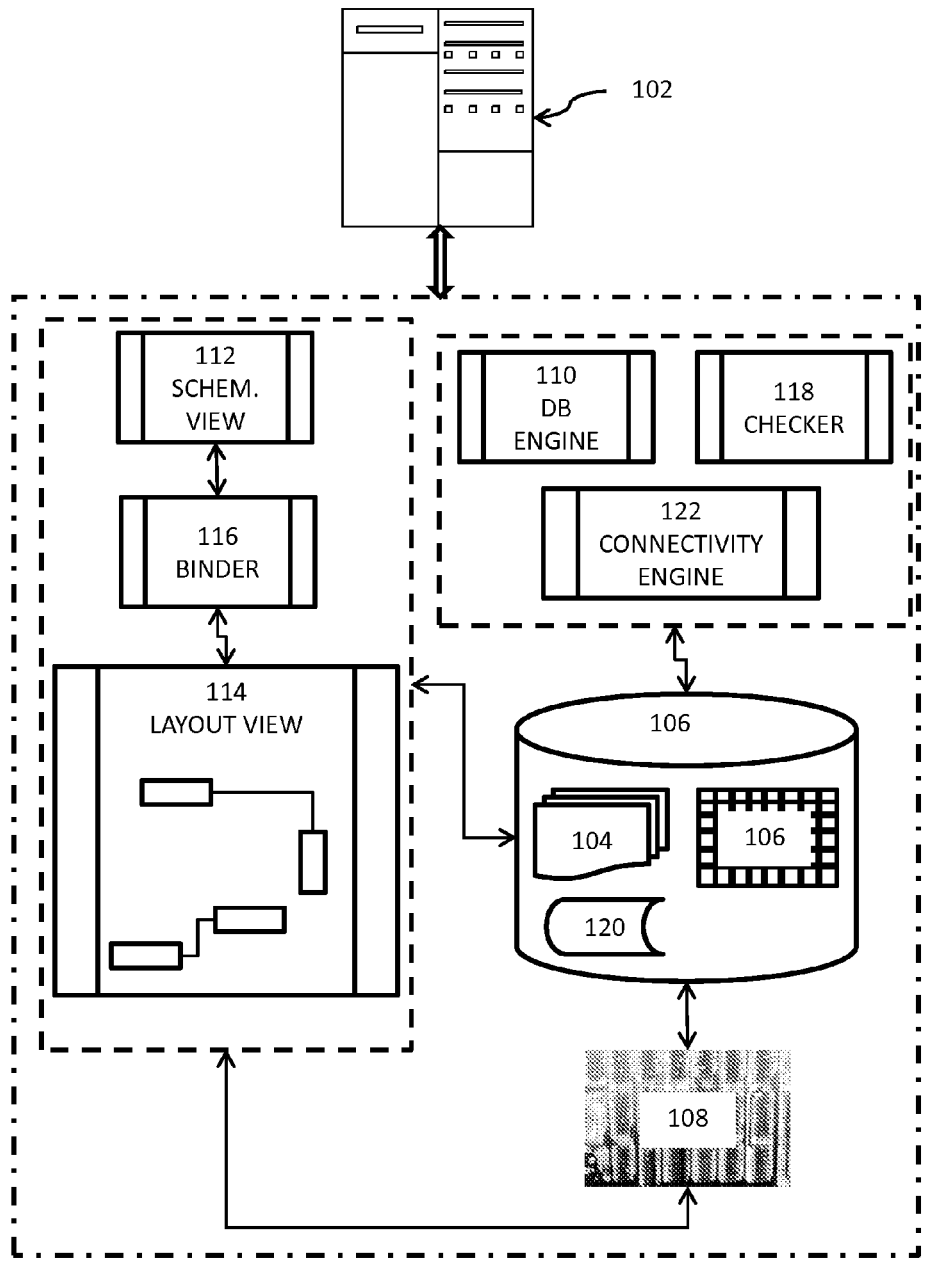
FIG. 1 illustrates a high level block diagram for implementing a physical design of an electronic circuit with automatic snapping in some embodiments.

Various embodiments of the invention are directed to a methods, systems, and articles of manufacture for implementing electronic circuit designs with electro-migration awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are a computer-implemented method and a system for implementing constraint and connectivity aware physical designs. At the top level of the flow, the method or system provides various modules and performs various processes to provide a connectivity-aware environment to interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in a in an interactive manner or in nearly real-time without having to perform such constraints checking in batch mode.

In these embodiments, the method or system creates one or more classes for the nets in the electronic design and formulate each at least net of the nets as an object of a particular class and store the at least one net accordingly. By treating a net as an object, these embodiments may associate various entities, such as one or more constraints, with the net. When an object, such as a geometric shape in a layout, is being created in the physical design, the method or the system further associates the object with a net, which also constitutes an object, and stores both the object and its associated net in a design database and thus provide the connectivity information for the object at the time the object is created in the electronic design. In other words, these embodiments no longer treat a net as a list of objects. Rather, these embodiments treat the net as an object that includes or is associated with one or more geometric shapes in the net to provide the connectivity information.

FIG. 1 illustrates a high level block diagram for implementing interactive, real-time checking or verification of constraints in some embodiments. In one or more embodiments, a designer may use one or more computing systems 102 to perform various processes or to invoke various hardware modules to create or manipulate an electronic design. The one or more computing systems 102 may comprise various electronic design tools such as, but not limited to, a schematic editor, a schematic simulator, a physical design tool, a physical design analysis engine, etc. The one or more computing system 102 may further initiate or interact with a schematic view 112 and a layout view 114 of an electronic design in some embodiments. In some embodiments, the layout view of an electronic design includes a partial, incomplete physical design that contains only a smaller portion of the physical design.

For example, the partial, incomplete physical design may contain only a single object that represents a single electronic design component, a net, or a portion thereof, an interconnect, a segment of an interconnect, an instance of a cell, a portion of an instance of a cell, etc. in some embodiments. The layout view 114 and the schematic view 112 may be bound together to allow communication of data or information between the two views of the electronic design with a binder mapping process or module 116. The one or more computing system 102 may also initiate or interact with a database engine 110 to, for example, perform or undo one or more transaction or maintaining one or more log records (e.g., undo logs, redo logs, state logs, etc.) in some embodiments. The one or more computing system 102 may also initiate or interact with a checker 118, such as a physical verification process or module or a design rule checking process or module in some embodiments.

The one or more computing system 102 may also initiate or interact with a connectivity engine 122 which performs the functions of, for example, receiving, updating, removing, or adding connectivity information, or maintaining other data or information about the connectivity information. Various embodiments use the connectivity information to keep track of which net a design component belongs to in an electronic circuit design. The one or more computing system 102, the processes or modules 110, 118, and 122, and the session for the schematic view design 112, the session for the layout view design 114, or the binder mapping process or module 116 may also initiate or interact with a non-volatile, non-transitory computer accessible medium 106 and a volatile, non-transitory computer accessible medium 108 to read data or information from or write data or information to these non-transitory computer accessible media.

In some embodiments, the non-volatile, non-transitory computer accessible medium 106 may store thereupon data or information that comprises, for example but not limited to, one or more rule decks 104 for various design rules, constraints, requirements, or goals (collectively constraint or constraints), one or more data structures 106 (e.g., database tables, lists, tables, trees, graphs, etc.), connectivity information, standard or custom libraries, or any other data 120 that are needed or desired for the performance of various processes disclosed herein. In some embodiments, the non-transitory volatile computer accessible medium 108 may store thereupon data or information that comprises, for example but not limited to, temporary data, uncommitted transaction data, temporary values of one or more variables or states of various processes or modules, etc. The one or more computing system 102 may also invoke a user interface to interact with a display apparatus (not shown) to provide interactive or nearly real-time feedback to a user.

Figure 2A:
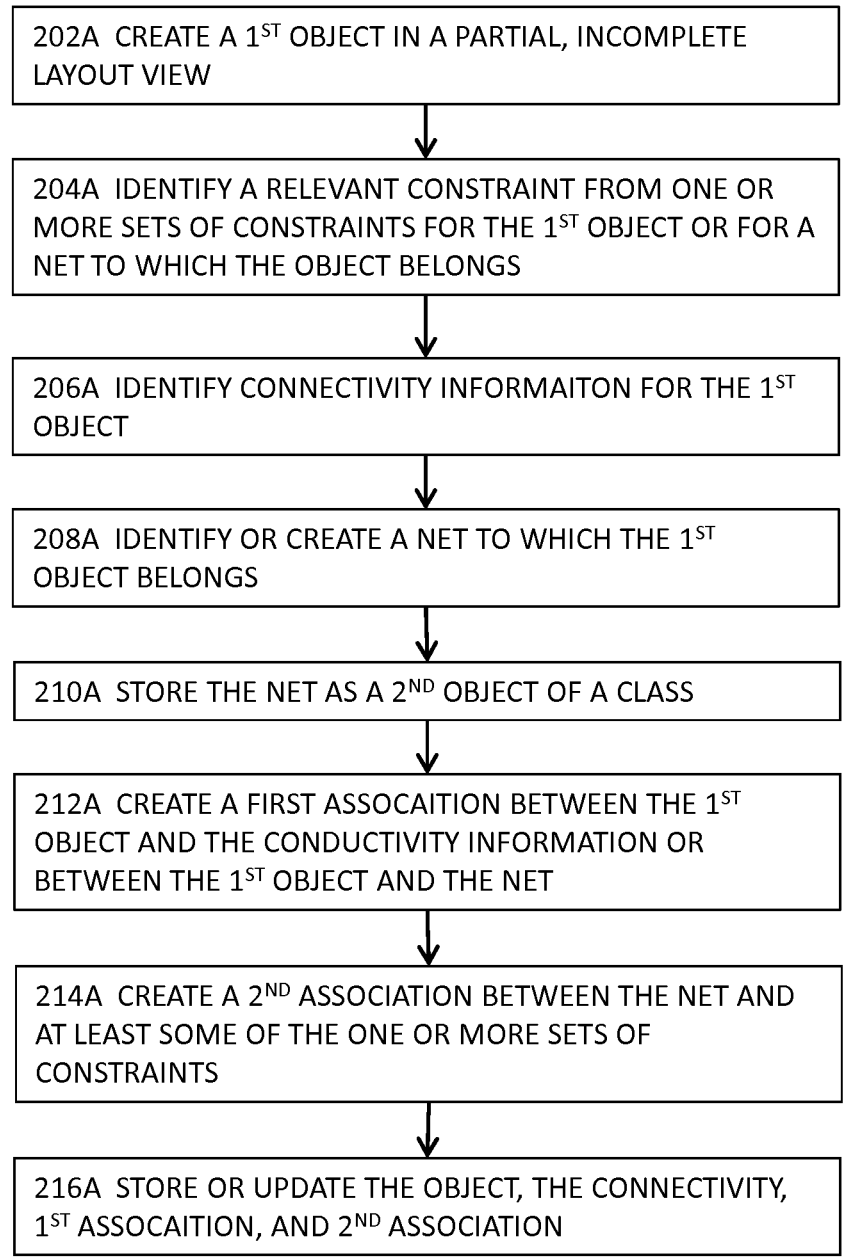
FIG. 2A illustrates a more detailed block diagram for implementing electronic designs with connectivity and constraint awareness in some embodiments.

FIG. 2A illustrates a more detailed block diagram for implementing a physical design of an electronic circuit with automatic snapping in some embodiments. In various embodiments illustrated in FIG. 2A, the method or system identifies or creates associations between an object, the net corresponding to the object, and various other entities such as one or more constraint regardless of when the object has already existed in a layout or when the object is being created for the first time in the layout. In one or more embodiments, the method or system for implementing electronic designs with connectivity and constraint awareness may comprise the respective process or module 202A of creating a first object in a physical design of an electronic circuit.

In some embodiments, the physical design of an electronic design includes a partial, incomplete physical design that contains only a smaller portion of the physical design. For example, the partial, incomplete physical design may contain only a single object that represent a single electronic design component, a single net, or a portion thereof. In various embodiments, an object in a physical design may comprise a geometric shape representing an electronic design component, a net, a smaller portion of a net, an interconnect, or a segment of an interconnect. In these embodiments, the method or system may create and store a net as an object of a particular class and thereby associate various other priorities or entities (e.g., one or more constraints) with a net.

In some embodiments, the method or system may comprise the respective process or module 204A of identifying one or more relevant constraints from one or more sets of one or more constraints, design rules, requirements, or goals (collectively constraint or constraints) for the first object or a net to which the first object belongs. In some embodiments, a relevant constraint may include, for example, the one or more relevant constraints involving multiple shapes and multiple geometric characteristics of each of these multiple shapes (e.g., corner-to-corner design rules), and a net-based constraint involving multiple nets (e.g., a net-to-net spacing constraint), a multi-valued constraint such as a voltage-based constraint (e.g., a voltage-based constraint that imposes different, for instance, different spacing values for different operating voltages or a spacing constraint depending upon parallel run-lengths between two adjacent objects), or a constraint defined by a list of permissible values, rather than a single value (e.g., a spacing constraint defined by a table of values based on, for example, parallel run-lengths). An example of a net-based constraint may comprise, for example, the permissible spacing between a clock net and a power net. In some embodiments where a net-based spacing constraint is involved, the method or system examines the minimum spacing between a first net and a second net and determines whether the first net and the second net satisfy the net-based spacing constraint. In some embodiments, a voltage-based constraint, which imposes, for example, different spacing values based on different operating voltages may be considered a part of a sub-set of net-based constraints because the operating voltages may depend upon the knowledge of the relevant net or connectivity information.

In some embodiments, the method or system may comprise the respective process or module 206A of identifying connectivity information for the first object. The connectivity information includes the information or data about a net to which an object belongs or how an object is connected to one or more other objects in some embodiments. The method or system may identify the connectivity information from the connectivity engine or receives user-specified connectivity information assigned by a designer to identify or create one or more shapes belonging to the same net. For example, the designer may specify which net a particular object belongs to. For a physical object that is being created in a layout, the method or system may associate the physical object with the connectivity information which may be either identified from the connectivity engine or provided or assigned by the designer.

For example, the method or the system may associate a physical object with the net to which the physical object belongs at the time the physical object is being created for the first time in the layout in some embodiments. In some embodiments, the method or system may comprise the respective process or module 208A of identifying or creating a net to which the first object belongs. In some embodiments, the method or system may identify such a net from the connectivity engine or from a user's specification. In some embodiments where the connectivity engine does not include the connectivity information indicating to which net the first object belongs, the method or system may create such a net from the schematic design view of the electronic design or may receive the designation or specification of the net to which the first object belongs.

In some embodiments, the method or system may comprise the respective process or module 210A of storing the information or data for the net as a second object of a particular class. In these embodiments, the method or system may treat and store the net as an object in the electronic design such that the net object is generally treated as a discrete entity and may include one or more routines and data as the objects in object-oriented programming. In these embodiments, the method or system may thus associate various other entities, attributes, properties, etc. with a net.

One of the advantages of storing a net as an object is that the method or system may associate, for example, one or more sets of one or more constraints with a given net so that the constraint checking or verification engine only need to examine these one or more sets of one or more constraints without having to going through the entire rule deck. Another advantage of this approach is that when a given net is defined as an object that is further associated with a plurality of constraints, a designer may load the net with one or more specific constraints to perform various types of what-if analyses or corner analyses for the net of interest by singling out these one or more specific constraints. In some embodiments, the method or system may comprise the respective process or module 212A of identifying or creating a first association between the first object and the connectivity information or between the first object and the net if they are not already associated.

In some of these embodiments where the first object has already been associated with the net or the connectivity information, the method or system may identify such an association. In some other embodiments of these embodiments where the first object has not been associated with a net or the connectivity information (e.g., when the first object is created for the first time), the method or system may then create such a first association. In some embodiments, the method or system may comprise the respective process or module 214A of identifying or creating a second association between the net and at least some of the one or more sets of one or more constraints. The association in 212A or 214A may comprise, for example but not limited to, a link, a symbolic link, a link data structure specifying the object and the associated net, a bitmap value associated with each object with the value indicating respective nets, a pointer, etc. In some embodiments, the method or system may comprise the respective process or module 216A of storing or updating the object, the connectivity information, the first association, or the second association either in a non-transitory, volatile or non-volatile computer accessible medium.

Figure 2B:
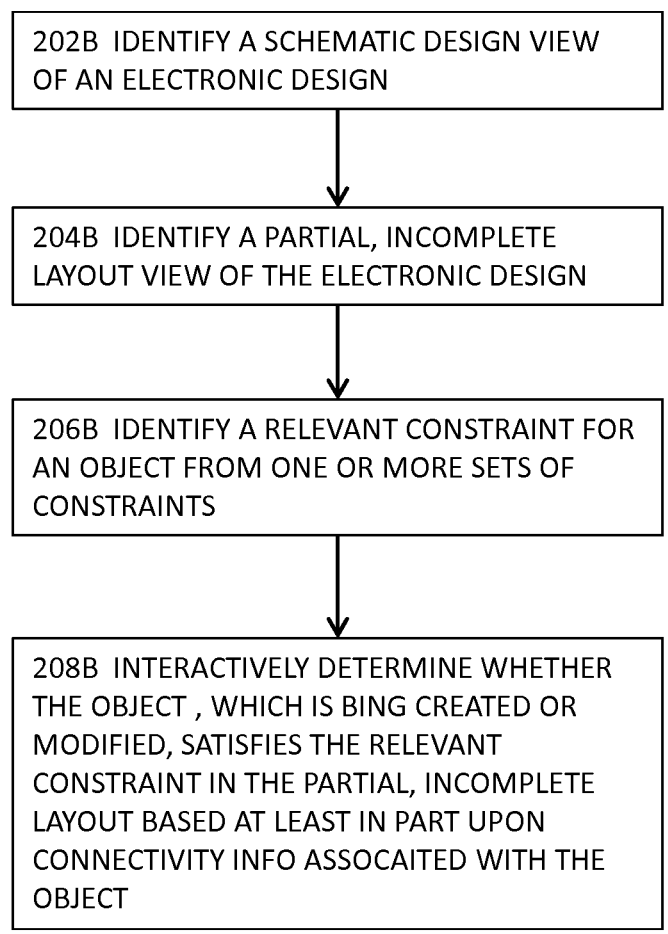
FIG. 2B illustrates a high level block diagram for implementing electronic designs with connectivity and constraint awareness in some embodiments.

FIG. 2B illustrates a high level block diagram for implementing electronic designs with connectivity and constraint awareness in some embodiments. In some embodiments, the method or system for implementing electronic designs with connectivity and constraint awareness may comprise the respective process or module 202B of identifying a schematic design view of an electronic design. In some embodiments, the method or system may further comprise the respective process or module 204B of identifying a layout of the electronic design. In some of these embodiments, the layout may comprise a partial, incomplete layout of the electronic design.

In some of these embodiments, the method or system may further identify a binder mapping process to pass information or data between the schematic design view and the layout view of the electronic design such that various types of information or data created or modified in the layout view may be communicated to the schematic design view via, for example, backward annotation, and various types of information or data created or modified in the schematic view may be communicated to the layout view via, for example, forward annotation. In some embodiments, the method or system may further comprise the respective process or module 206B of identifying one or more relevant constraints for an object from one or more sets of one or more constraints. In some embodiments where at least one constraint of the one or more relevant constraints needs or desires the information or data about a net, the method or system may further identify the at least one constraint based at least in part upon the connectivity information, which may be identified from a connectivity engine or may be identified or specified by a user.

In some embodiments where a net is created and maintained as an object, and where the net object or its class has already been associated with some relevant constraints, the method or system may identify the one or more relevant constraint from the net object or its class. In some of these embodiments, the method or system may identify multiple sets of constraints, where each set comprises one or more constraints. For example, the method or system may identify a constraint which imposes different spacing requirements for different operating voltages, where a spacing requirement for a fixed operating voltage also varies with the parallel run-length between two objects. In this example, the method or the system may identify one set of constraints for each operating voltage, where the set further includes multiple spacing values for different (continuous or discrete) parallel run-lengths. These embodiments are in sharp contrast with the conventional approach that can handle only one set of one or more constraints that control the relationships between two or more objects in a design.

In some embodiments, the method or the system may identify or select or may allow a designer to identify or select one or more constraints from these one or more sets, each having one or more constraints. For example, the method or the system may, depending upon the type of analyses or design objectives, identify or select certain constraints (e.g., worst-case cases) from the one or more sets of one or more constraints in some embodiments. As another example, the method or the system may allow a designer to identify or select one or more relevant constraints for, for example, a single- or multiple-scenario what-if analysis in some embodiments. In some embodiments, the method or system may further comprise the respective process or module 208B of interactively determining whether the object or a net, which is being created for the first time in the layout or is being modified, satisfies the one or more relevant constraints based at least in part upon the connectivity information associated with the object.

Figure 2C:
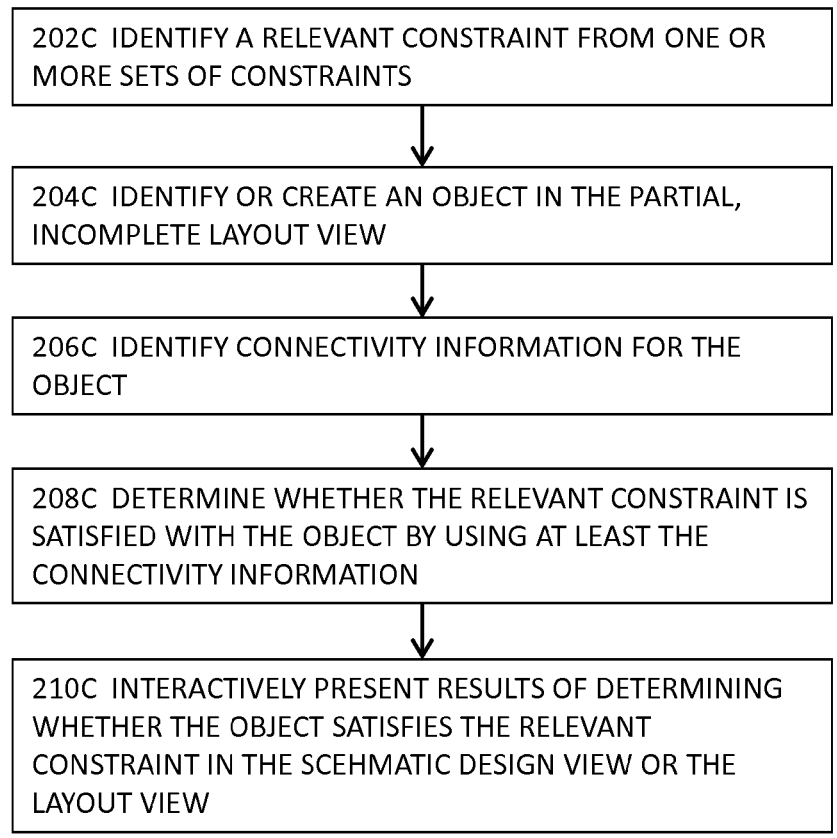
FIG. 2C illustrates more details about the process or module 206B illustrated in FIG. 2B in some embodiments.

FIG. 2C illustrates a high level block diagram for implementing electronic designs with connectivity and constraint awareness in some embodiments. In some embodiments, the method or system for implementing electronic designs with connectivity and constraint awareness may comprise the respective process or module 202C of identifying one or more relevant constraint from one or more sets of constraints, each having one or more constraints. In some embodiments, the method or system may further comprise the respective process or module 204C of identifying or creating an object in the layout. In various embodiments, an object in a layout may comprise a geometric shape representing an electronic design component, a net, a smaller portion of a net, an interconnect, or a segment of an interconnect.

In some embodiments, the method or system may identify a modification process that is to be performed on the object. A modification process may include, for example but not limited to, creating or adding, removing, translating, rotating, mirroring, resizing the geometric shape in the physical design or placement, routing, or post-route optimization. In some embodiments, the method or system for implementing electronic designs with connectivity and constraint awareness may comprise the respective process or module 206C of identifying the connectivity information for the object. The method or system may identify the connectivity information from a conductive engine on which all connectivity information for all objects up to a certain point in time of the electronic design in a design process flow in some embodiments.

In various embodiments, the connectivity information associated with an object in the electronic design is created or identified and is associated with the object at the time the object is created. In these embodiments, the method or system may thus identify the connectivity information, such as the net to which an object belongs, by using what is already available in the connectivity information without having to perform extraction on the layout or to rebuild the net by using, for example, net tracing techniques. In some embodiments, the method or system may comprise the respective process or module 208C of determining whether the object, which may or may not be undergoing a modification process, satisfies the one or more relevant constraints by using at least the connectivity information.

For example, if the method or system needs to check a net-to-net spacing constraint, which imposes some limitations on, for example, the spacing between the first net to which the object belongs and the second net to which another object belongs, the method or system may identify the first net and the second net from the connectivity information from the first object and the aforementioned another object and performs the constraint checking or verification on the first net and the second net to see if the net-to-net constraint is satisfied. In some embodiments, the method or system may comprise the respective process or module 210C of interactively presenting or displaying results of the act of determining whether the object satisfies the one or more relevant constraints in the schematic design view or in the layout view of the electronic design.

In some of these embodiments, the method or the system interactively presents or displays results of the action of determining whether the one or more relevant constraints are satisfied in, for example, a user interface during the performance of a modification process on the object of interest. In these embodiments, the method or the system provides the results of the constraint checking interactively in response to, for example, one or more operations of the modification process. In some embodiments, the method or the system presents or displays results of the action of determining whether the one or more relevant constraints are satisfied in a user interface in a nearly real-time manner.

In some embodiments, being in real-time includes the scenarios where certain operations (e.g., checking a constraint against an object) are relating to a time frame that is imposed by external constraints, and the response of a system for these certain operations matches a user's perception of time or proceeds at the same rate as a physical or external process. Nonetheless, it is also understood that any operations on a computing system may take certain period of time, which may vary from a few nano-seconds to some extended period of time. For example, it may take the system a split of a second to check a constraint multiple objects. Nonetheless, the aforementioned "in nearly real-time" refers to the fact that the system may still need a period of time to complete the constraint checking while the object is being created or modified in an electronic circuit design, although this period of time may not even be perceptible by a human designer or user. More details about the process or module 208C of determining whether the object satisfies the one or more relevant constraints and the process or module 210C of interactively presenting or displaying results are provided in the U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby incorporated by reference in its entirety for all purposes.

Figure 3A:
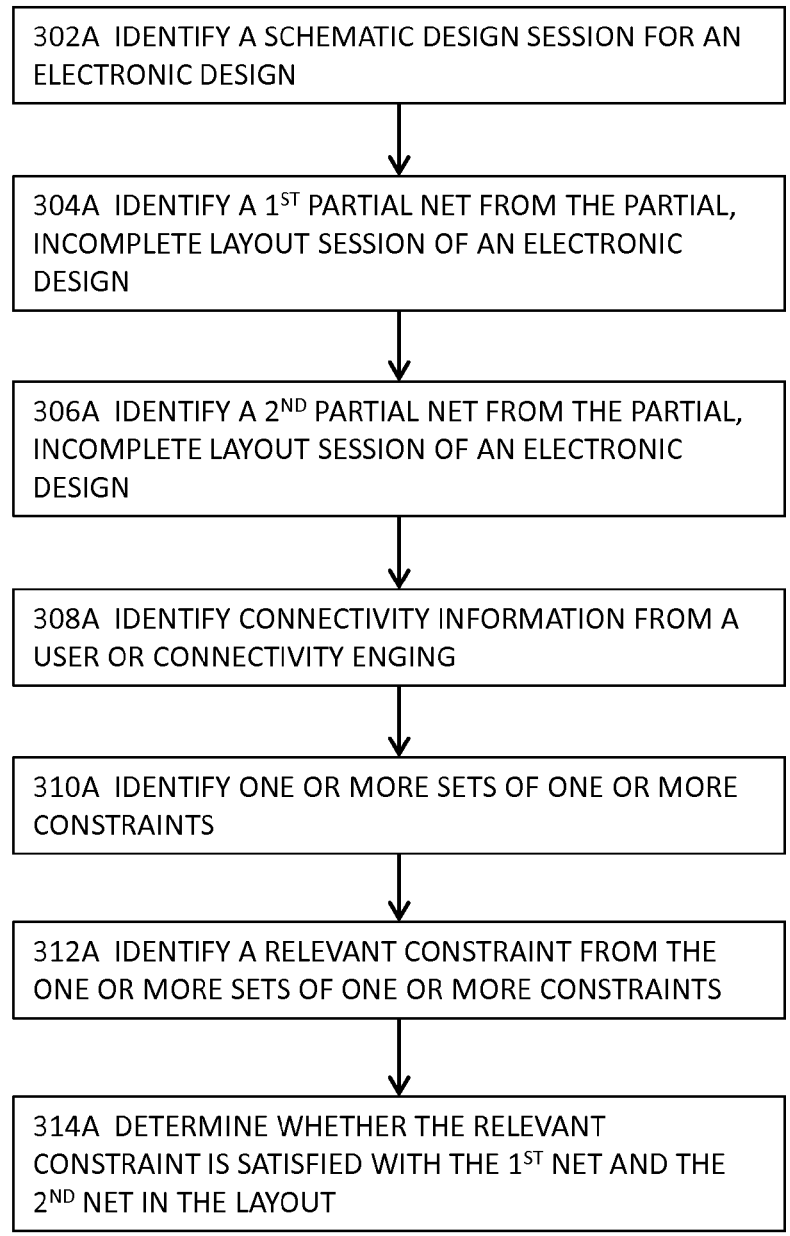
FIG. 3A illustrates a more detailed block diagram for a method or system for implementing electronic designs with connectivity and constraint awareness in some embodiments.

FIG. 3A illustrates a more detailed block diagram for a method or system for implementing electronic designs with connectivity and constraint awareness in some embodiments. Various embodiments illustrated in FIG. 3A includes some exemplary implementations to determine whether some constraints, such as some net-based constraints, may be satisfied with one or more nets in a layout of an electronic circuit. In some embodiments, the method or system for implementing electronic designs with connectivity and constraint awareness may comprise the respective process or module 302A of identifying or initiating a schematic design session including a schematic design view of an electronic design. In some embodiments, the method or system for implementing electronic designs with connectivity and constraint awareness may comprise the respective process or module 304A of identifying a net from a physical design session including a layout for the electronic design.

In some embodiments, the layout may comprise a partial, incomplete physical design of the electronic design. In some embodiments, the net may comprise only a partial, incomplete net. In some embodiments, the process or module 304A may further include the respective process or module for identifying or initiating the physical design session including layout view of the electronic design. In some embodiments, the method or system for implementing electronic designs with connectivity and constraint awareness may comprise the respective process or module 306A of identifying a second net from the layout of the electronic circuit design. In some embodiments, the second net only comprises a partial, incomplete net. In these embodiments, the method or the system does not require a complete net to perform various functions to achieve its intended purposes.

In some embodiments, the method or system for implementing electronic designs with connectivity and constraint awareness may comprise the respective process or module 308A of identifying connectivity information. The connectivity information may be identified from a connectivity engine or may be provided or specified by a designer in a substantially similar manner as that described with reference to FIG. 2A in some embodiments. In some of these embodiments, the connectivity information may be provided or specified by a designer on the fly at the time an object is created or identified for various purposes. In some embodiments, the method or system for implementing electronic designs with connectivity and constraint awareness may comprise the respective process or module 310A of identifying one or more sets of one or more constraints in a substantially similar manner as that described with reference to FIGS. 2A-B.

In some embodiments, the method or system for implementing electronic designs with connectivity and constraint awareness may comprise the respective process or module 312A of identifying one or more relevant constraints from one or more sets of constraints, while each of these one or more sets includes one or more constraints. In some embodiments, the one or more relevant constraints comprise a net-based constraint that desires or requires information or data of one or more nets to determine various attributes of such one or more nets. An example of such a net-based constraint comprises, for example, a constraint that imposes a spacing requirement between two nets. In some embodiments, the process or module 312A is performed in a substantially similar manner as that described in some of the preceding passages with reference to FIGS. 2A-B.

In some embodiments, the method or the system maintains both the first net and the second net as objects of one or more classes and associates each of the two nets with one or more corresponding sets of one or more constraints. The method or system may then identify at least some of the associated one or more corresponding sets of one or more constraints at 310A in some embodiments. In some embodiments, the method or system may provide multiple options to a designer and allow the designer to select one or more relevant constraints from the associated one or more corresponding sets of one or more constraints.

In some embodiments, the method or system for implementing electronic designs with connectivity and constraint awareness may comprise the respective process or module 314A of determining whether the one or more relevant constraints are satisfied with the first net and the second net in the layout. In the previous example of a net-to-net spacing constraint, the method or the system may perform various processes to determine whether the net-to-net spacing constraint is satisfied between the first net and the second net. More details about the process or module of determining whether a constraint is satisfied are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby incorporated by reference in its entirety.

Figure 3B:
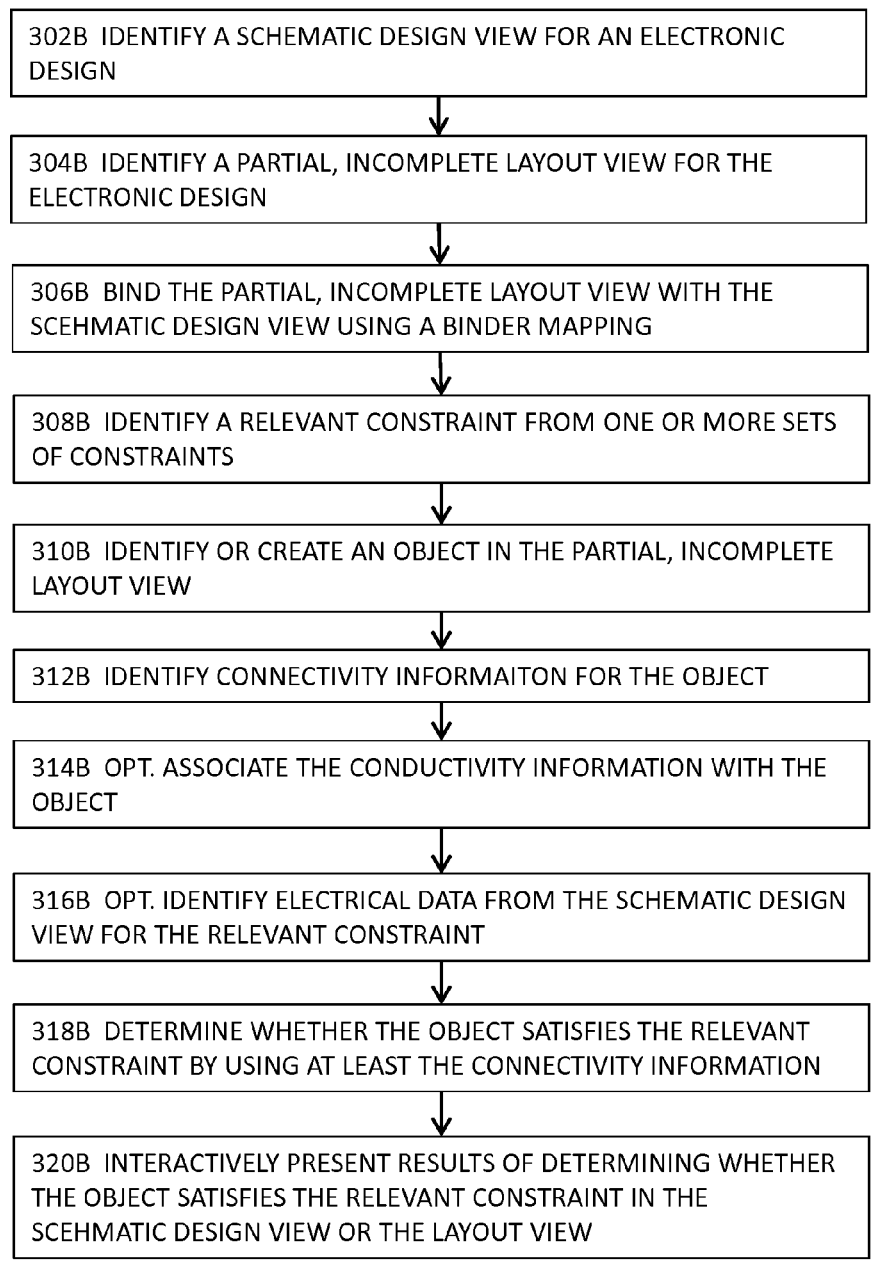
FIG. 3B illustrates a more detailed block diagram for a method or system for implementing electronic designs with connectivity and constraint awareness in some embodiments.

FIG. 3B illustrates a more detailed block diagram for a method or system for implementing electronic designs with connectivity and constraint awareness in some embodiments. In some embodiments, the method or system for implementing electronic designs with connectivity and constraint awareness may comprise the respective process or module 302B of identifying or initiating a schematic design session including a schematic design view of an electronic design. In some embodiments, the method or system for implementing electronic designs with connectivity and constraint awareness may comprise the respective process or module 304B of identifying or initiating a physical design session including a physical design view of an electronic design.

In some embodiments, the physical design view comprises only a partial, incomplete layout of the electronic design. In some embodiments, the method or system for implementing electronic designs with connectivity and constraint awareness may comprise the respective process or module 306B of binding the physical design session with the schematic design session by using at least a binder mapping process or module, which passes information or data, such as annotations or design data or information, between the schematic design session and the physical design session. In these embodiments, all the changes in data or information in the physical design session due to, for example, one or more modification processes that are performed on the physical design view of the electronic design may be created, formatted, translated, or mapped to the schematic design view of the electronic design via, for example, backward annotations. In addition, all the changes in data or information in the schematic design session due to, for example, one or more modification processes that are performed on the schematic design view of the electronic design may be created, formatted, translated, or mapped to the physical design view of the electronic design via, for example, forward annotations.

In some embodiments, the method or system for implementing electronic designs with connectivity and constraint awareness may comprise the respective process or module 308B of identifying one or more relevant constraints from one or more sets of one or more constraints. In some embodiments, the process or module 308B is performed in a substantially similar manner as that described in some of the preceding passages with reference to FIGS. 2A-B. In some embodiments, the method or system for implementing electronic designs with connectivity and constraint awareness may comprise the respective process or module 310B of identifying or creating an object in the layout view and the respective process or module 3128 of identifying connectivity information for the object.

In some embodiments, the connectivity information of the object may be identified from, for example, a connectivity engine or may be identified or specified by a designer. In these embodiments, the connectivity information of the object may be thus identified at the time the object is created for the first time in the layout view. One of the advantages is that the method or system may utilize the connectivity information of the object without having to perform extraction on the layout or having to trace the nets to rebuild the net to which the object belongs in order to obtain the connectivity for the object. In some embodiments, the method or system for implementing electronic designs with connectivity and constraint awareness may optionally comprise the respective process or module 314B of associating the connectivity information with the object.

In some embodiments, each object is maintained as an object of a particular class as in the cases of object-oriented programming and thus may be associated with the connectivity information, which identifies, for example, to which net the object belongs or how the object is connected in the layout of the electronic design. In some embodiments, the method or system for implementing electronic designs with connectivity and constraint awareness may optionally comprise the respective process or module 316B of identifying electrical data from the schematic from the schematic design view. In these embodiments, the method or system may desire or require some electrical data or information for at least one of the one or more relevant constraints. On the other hand, such electrical data or information may not be available due to the partial, incomplete layout. In these embodiments, the method or system may identify such electrical data from the schematic design session, for example from some schematic simulation results, or may invoke the schematic simulation module to perform some forms of simulation at the schematic level to generate such electrical data.

The method or the system may then invoke the binder mapping process to communicate such electrical data to the physical design session to, for example, further determine whether the at least one relevant constraint is satisfied with the mapped electrical data. For example, a constraint may impose different spacing values based upon different operating voltages. In determining whether the constraint is satisfied, the method or the system may identify the voltage data or information and use the voltage data or information in determining whether the constraint is satisfied. In some embodiments, the method or system for implementing electronic designs with connectivity and constraint awareness may optionally comprise the respective process or module 318B of determining whether the one or more relevant constraints are satisfied with the object by using at least the connectivity information.

In these embodiments with the connectivity information available, the method or the system may thus use the connectivity information in implementing the electronic design wherever the connectivity information is needed or desired. For example, the method or system may create an object in a layout with the connectivity information that provides the information or data for the net to which the object belongs or for how the object is connected in the layout. The method or system may further perform constraint checking or verification to determine whether a constraint that requires or desires the connectivity information is satisfied with one or more objects in the layout. In some embodiments, the method or system for implementing electronic designs with connectivity and constraint awareness may optionally comprise the respective process or module 320B of interactively presenting or displaying results of the process or module 318B of determining whether the one or more relevant constraints are satisfied with the object in the layout.

In some embodiments, the method or system may utilize the connectivity information, which is available at the time of creation of each object in the layout, to implement the electronic design without performing extraction on the layout or without rebuilding the nets by, for example, using net tracing techniques. More details about the process or module of determining whether a constraint is satisfied are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby incorporated by reference in its entirety.

Figure 4:
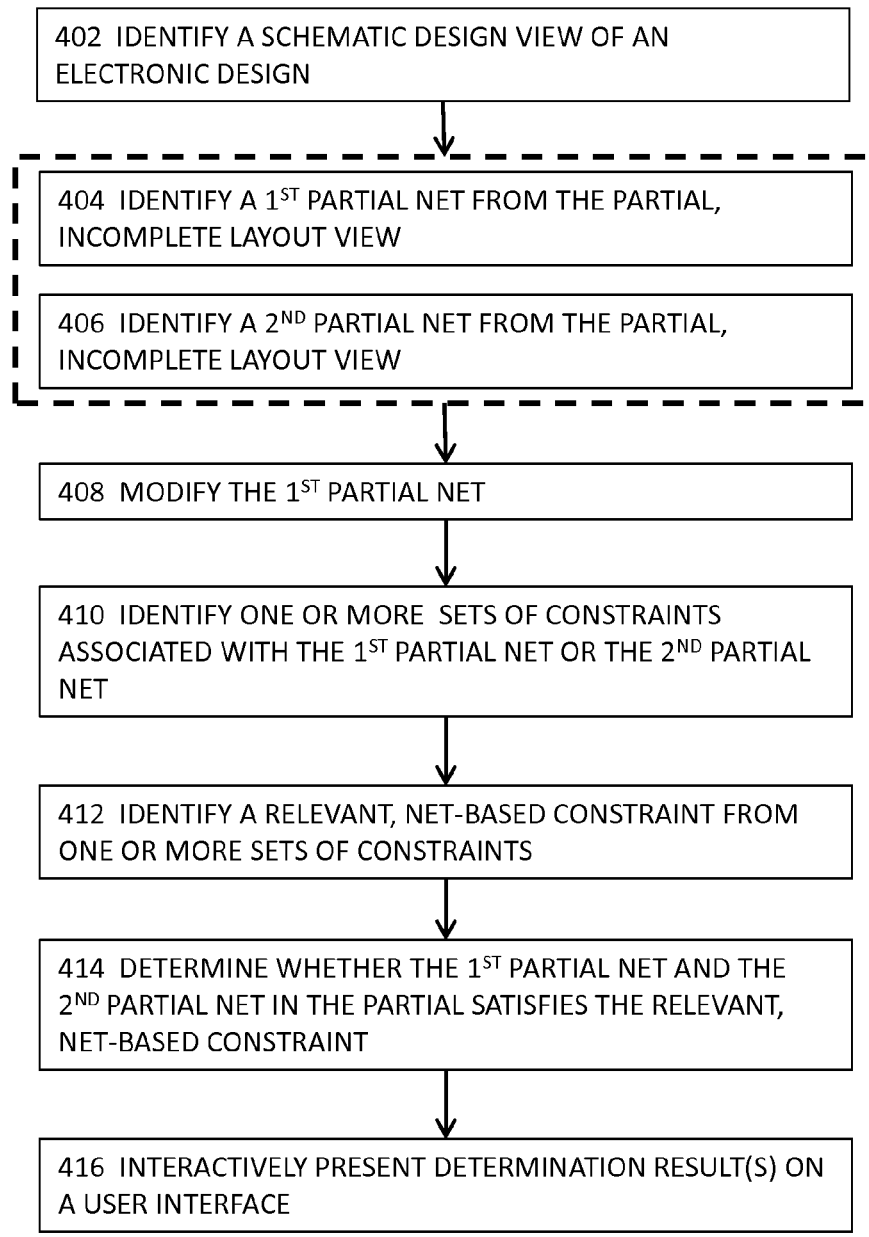
FIG. 4 illustrates a more detailed block diagram for a method or system for implementing electronic designs with connectivity and constraint awareness in some embodiments.

FIG. 4 illustrates a more detailed block diagram for a method or system for implementing electronic designs with connectivity and constraint awareness in some embodiments. In some embodiments, the method or system may comprise the respective process or module 402 of identifying or initiating a schematic design session including a schematic design view of an electronic design. In some embodiments, the method or system may comprise the respective process or module 404 of identifying a first net from a physical design of a physical design session for the electronic design. In some embodiments, the method or system may comprise the respective process or module 406 of identifying a second net from the physical design of the electronic design.

In some embodiments, the physical design or the layout may comprise only a partial, incomplete layout of the electronic design. In some embodiments, the first net or the second net may comprise only a partial, incomplete net. In some embodiments, the method or system may comprise the respective process or module 408 of modifying the first net by performing a modification process on the first net to make one or more changes in the physical design with respect to the first net. In some embodiments, the method or system may comprise the respective process or module 410 of identifying one or more sets of constraints that are respectively associated with the first net and the second net. In some embodiments, each of the first net and the second net is associated with corresponding one or more sets of one or more relevant constraints.

In some embodiments, both the first net and the second net are associated with the same one or more sets of one or more relevant constraints. In some embodiments, the method or system may comprise the respective process or module 412 of identifying one or more relevant constraints from the one or more sets of one or more relevant constraints in a substantially similar manner as that described in some of the preceding paragraphs with reference to FIG. 2A. In some embodiments, the method or system may comprise the respective process or module 414 of determining whether the one or more relevant constraints are satisfied with the first net and the second net. More details about the process or module 414 of determining whether the one or more relevant constraints are satisfied are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby incorporated by reference in its entirety.

In some embodiments, the method or system may comprise the respective process or module 416 of interactively presenting or displaying results of the process or module 414 of determining whether the one or more relevant constraints are satisfied. In some embodiments, the method or system presents or displays the results to a designer via, for example, a user interface. In these embodiments, the disclosed method or system uses the connectivity information provided by a connectivity engine or assigned by a designer to present or display feedback to a user as to whether a newly created object or a newly modified object complies or violates certain relevant constraints in a in an interactive manner or in nearly real-time without having to perform such constraints checking in batch mode.

Moreover, the method or system may present or display such results to a designer even before the creation or modification of an object is completed in the electronic design or even before the violation actually occurs and thus avoids the costly repair processes of first completing an electronic design and then performing the constraint checking or verification process with subsequent repair processes. More details about the process or module 416 are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby expressly incorporated by reference in its entirety for all purposes.

Figure 5:
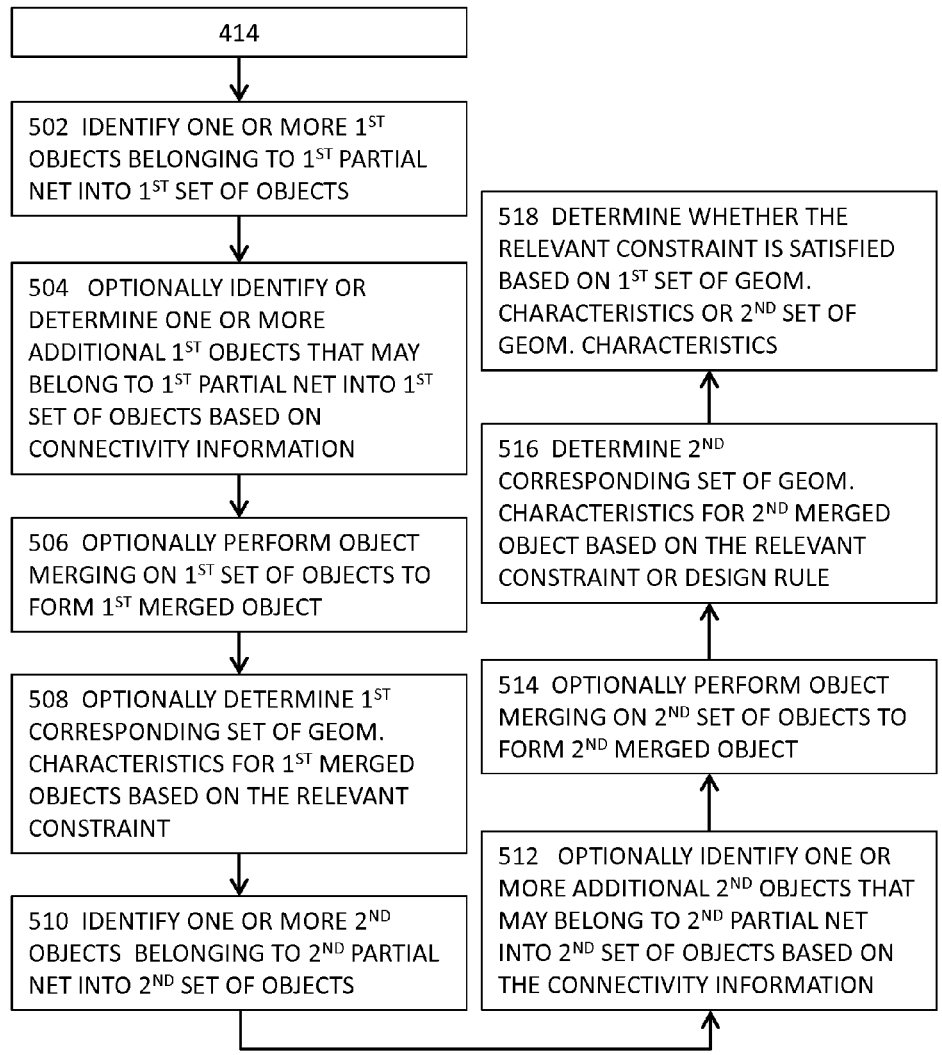
FIG. 5 illustrates more details for the process or module 414 illustrated in FIG. 4 in some embodiments.

FIG. 5 illustrates more details for the process or module 414 illustrated in FIG. 4 in some embodiments. In some embodiments, the process or module 414 may comprise the respective process or module 502 of identifying one or more first objects, which belong to a first net, into a first set of objects for an electronic design. An object may comprise a geometric shape in the electronic design, a net or a portion thereof, a cell instance, or a portion of the layout of the electronic design in some embodiments. In some embodiments, the first net comprises only a partial, incomplete net. In some embodiments, the first set constitutes a dynamic set of objects that is to be created or modified in the electronic design.

In some embodiments, the process or module 414 may optionally comprise the respective process or module 504 of identifying or determining one or more additional first objects, which may belong to the first net, into the first set of objects based at least in part upon the connectivity information. In some embodiments, the connectivity information includes data or information that indicates to which net each of the one or more additional first objects belong or how each of the one or more additional first objects is connected in a layout of the electronic design. In some embodiments, the process or module 414 may optionally comprise the respective process or module 506 of performing an object merging process on the first set of objects to form a first merged object.

In some embodiments, an object merging process merges two or more objects, which overlap each other, to form a unified object. In some embodiments, the object merging process determines a bounding box to enclose a set of objects even though some of the set of objects may not necessarily overlap each other. In these embodiments, the object merging process ignores some gaps between objects and determines the bounding box to enclose the set of objects to form a merged box corresponding to the bounding box such that the merged object may be manipulated as a whole. In some embodiments depending upon the geometric configuration of the first set of objects, the object merging process generates more than one object and correlates all objects in the set of objects with each other such that the set of shapes may be manipulated (e.g., moved) together.

In some embodiments, the unified object comprises a result of performing the logical disjunction on the first set of objects. In some embodiments, the process or module 414 may optionally comprise the respective process or module 508 of determining a first corresponding set of geometric characteristics for the first merged object based at least in part upon the one or more relevant constraints. In some embodiments, the first set of geometric characteristics comprise data or information such as the shape of the merged object, the coordinates of the vertices of the merged object, etc. In some embodiments, the first set of geometric characteristics comprises data or information such as a bounding box for the external boundary of the merged object that may be determined by offsetting the external boundary by certain value based on, for example, a spacing constraint that is related to at least some of the objects in the first set of objects.

In some embodiments, the process or module 414 may comprise the respective process or module 510 of identifying one or more second objects, which belong to a second net, into a second set of objects. In some embodiments where the first set of objects constitutes a set of dynamic objects, one or more primary objects, or a combination that is subject to a creation or modification process, the second set of objects constitutes a static set of objects whose location in the electronic design remains unchanged, at least during the creation or modification process. For example, the process or module may identify one or more objects, which are already existing in the electronic design, into the second set of objects. The second set of objects may further comprise one or more target objects, which may be identified or designated at any time by the method, system, or users.

In some embodiments where a plurality of sources are involved, a primary object may comprise one of the sources to represent the plurality of sources. A source comprises a dynamic object in a layout that is subject to one or more modification processes or to which one or more modification processes apply. For example, when the method or system identifies a cell instance of multiple objects as sources in some embodiments, the method or system may identify or designate one dynamic object from the multiple sources in the cell instance as the primary object. In this example, the method or system may identify designate one of the plurality of sources as a primary object and performs various processes (e.g., automatic snapping) described herein to position the plurality of sources based on the positioning of the primary object. A practical example comprises the case where the method or system identifies and designates or allows a user to identify and designate a n-type well in a CMOS (complimentary-metal-oxide-semiconductor) device as a primary object and snaps the primary object to, for example, an IC power supply pin ($V_{DD}$) for the CMOS device. In various embodiments, the method or system may identify and designate or allow a user to identify and designate an object or a part thereof (e.g., an edge) in a set of objects (e.g., an instance of a cell) and performing various processes or actions on the primary object to position the entire set of objects.

In some embodiments, the first set or the second set of objects may comprise, for example but not limited to, a net, a smaller portion of a net, a cell instance, or a portion of a cell instance. In some embodiments, the process or module 414 may optionally comprise the respective process or module 512 of identifying one or more additional second objects, which may also belong to the second net, into the second set of objects based at least in part upon the connectivity information associated with the second net. In some embodiments, the process or module 414 may optionally comprise the respective process or module 514 of performing the object merging process on the second set of objects to form a second merged object in a substantially manner as that to form the first merged object with the first set of objects.

In some embodiments, the process or module 414 may comprise the respective process or module 516 of determining a corresponding second set of geometric characteristics associated with the second set of characteristics based at least in part upon at least some of the one or more relevant constraints that may be related to or associated with at least some of the second set of objects. In some embodiments, the process or module needs only perform one of the process or module 508 and the process or module 516. In other words where the geometric characteristics are associated with at least some of the one or more relevant constraints, the method or process need only determine either the first set of geometric characteristics or the second set of geometric characteristics.

In some other embodiments where the geometric characteristics correspond to the geometries of the merged object (the first merged object or the second merged object), the method or system determines both the first set of geometric characteristics and the second set of geometric characteristics. In some embodiments, the process or module 414 may comprise the respective process or module 518 of determining whether the one or more relevant constraints are satisfied. In some embodiments, the process or module 414 determines whether the one or more relevant constraints are satisfied by examining the spatial relationship between the first set of objects and the second set of objects. More details about the process or module 518 of determining whether the one or more relevant constraints are satisfied are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby incorporated by reference in its entirety.

Figure 6:
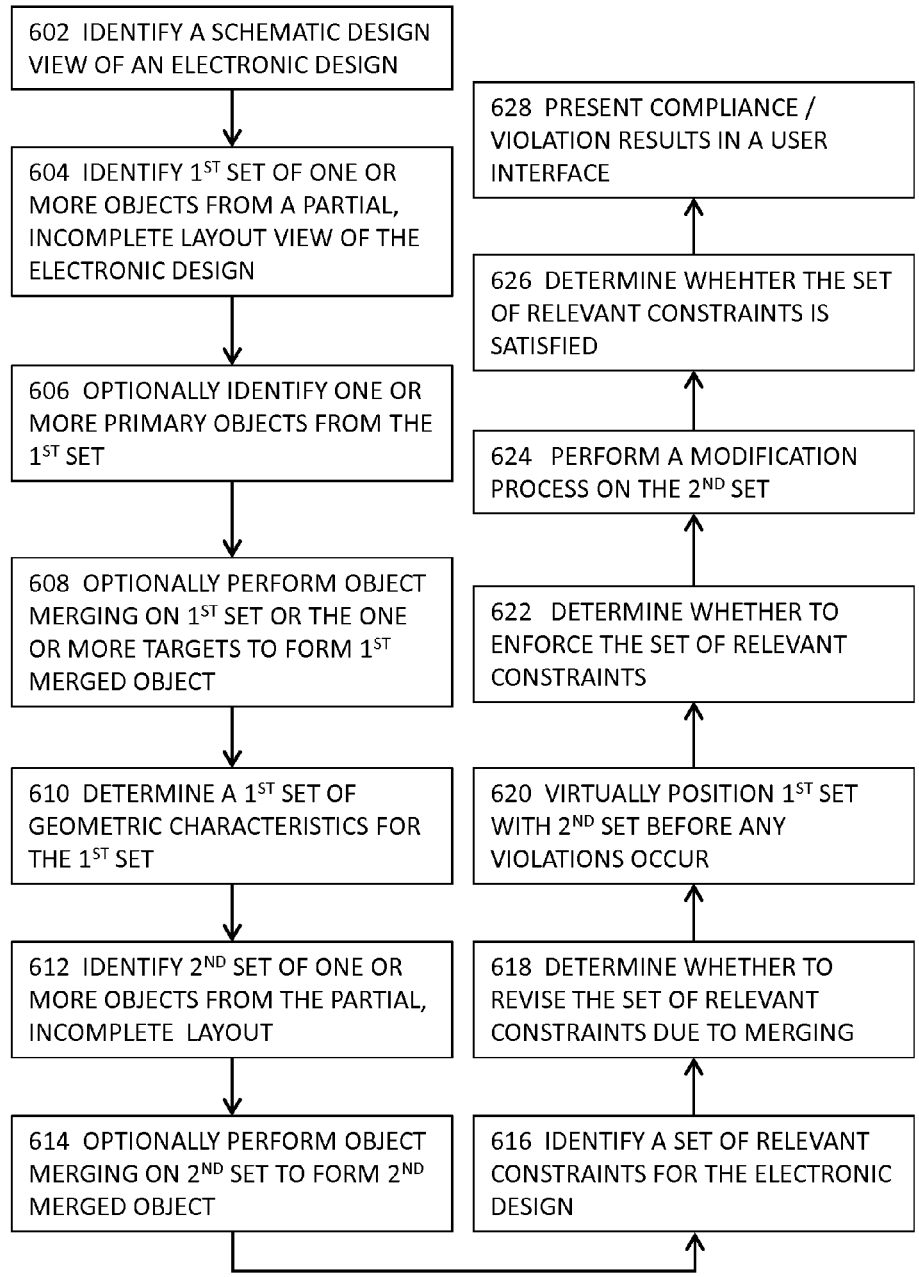
FIG. 6 illustrates a more detailed block diagram for a method or system for implementing electronic designs with connectivity and constraint awareness in some embodiments.

FIG. 6 illustrates a more detailed block diagram for a method or system for implementing electronic designs with connectivity and constraint awareness in some embodiments. In some embodiments, the method or system may comprise the respective process or module 602 of identifying or initiating a schematic design session including a schematic design view of an electronic circuit. In some embodiments, the method or system may comprise the respective process or module 604 of identifying a first set of one or more objects from a layout of the electronic design. In some embodiments, the layout may comprise only a partial, incomplete physical design of the electronic design. In some embodiments, the method or system may optionally comprise the respective process or module 606 of identifying one or more target objects in the layout.

In some embodiments, the method or the system may further comprise the respective process or module of identifying one or more primary objects from the one or more sources in the layout. In some embodiments, the method or system may optionally comprise the respective process or module 608 of performing an object merging process on the first set of objects, on the one or more targets, or on the one or more primary objects to form a first merged object in a substantially similar manner as that described in some of the preceding passages with reference to FIG. 5. In some embodiments, the method or system may comprise the respective process or module 610 of determining a first set of geometric characteristics for the first set of objects in a substantially similar manner as that described in some of the preceding passages with reference to FIG. 5.

In some embodiments, the method or system may comprise the respective process or module 612 of identifying or creating a second set of one or more objects from the layout of the electronic design. In some embodiments, the second set of objects constitute a dynamic set of objects that is subject to a creation or modification process, and the first set of objects constitute a static set of objects that remains unchanged in the electronic design, at least during the performance of the creation or modification process for the second set of objects. In some embodiments, the method or system may optionally comprise the respective process or module 614 of performing the object merging process on the second set of objects to for a second merged object. In some embodiments, an object merging process merges two or more objects, which overlap each other, to form a unified object.

In some embodiments, the object merging process determines a bounding box to enclose a set of objects even though some of the set of objects may not necessarily overlap each other. In these embodiments, the object merging process ignores some gaps between objects and determines the bounding box to enclose the set of objects to form a merged box corresponding to the bounding box such that the merged object may be manipulated as a whole. In some embodiments depending upon the geometric configuration of the first set of objects, the object merging process generates more than one object and correlates all objects in the set of objects with each other such that the set of shapes may be manipulated (e.g., moved) together.

In some embodiments, the method or system may optionally comprise the respective process or module 616 of identifying one or more relevant constraints from one or more sets of constraints that may be associated with at least some objects in the first set of objects, the second set of objects, or other objects in the electronic design. In some embodiments, the method or system may optionally comprise the respective process or module 618 of determining whether or not the method or system is to revise the one or more relevant constraints due to the object merging process. For example, the parallel run-length between a first set of objects and the second set of objects may be different from that between a first merged object and the second set of objects or that between the first set of objects and the second merged object. In this example, if one constraint of the one or more relevant constraints comprises, for example, a multi-valued spacing constraint that imposes different spacing requirements for different parallel run-lengths between two objects, the method or system may determine one or more appropriate value based at least in part upon the performance of the object merging process on the first set or on the second set of objects.

In some embodiments, the method or system may optionally comprise the respective process or module 620 of positioning (e.g., aligning, moving, etc.) the first set of objects with the second set of objects. In some embodiments, the method or system performs 620 on a copy of the electronic design or a portion thereof in a volatile computer accessible memory, such as one or more scratch pads, without persistently storing the results of such positioning in some embodiments. In other words, the method or system virtually positions the first set of objects relative to the second set of objects before the changes due to the positioning actually occur in the electronic design.

In some embodiments, the method or system uses one or more database transactions for 620 without committing the results of the one or more transactions such that the changes resulting from the one or more transactions may be undone. More details about using a scratch pad or a transaction are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby expressly incorporated by reference in its entirety for all purposes. In these embodiments, the method or the system may thus analyzing such a positioning as a what-if scenario to determine whether such a positioning causes any issues in the electronic design before any such issues actually arises.

In some embodiments, the method or system may optionally comprise the respective process or module 622 of determining whether or not at least one of the one or more relevant constraints is to be enforced. For example, the method or system may determine whether a constraint that is associated with both an object in the first set of objects or a primary object and a target object should be enforced in some embodiments. The method or system may even determine whether or not a constraint that is associated with both an object in the first set of objects or a primary object and a target object should be enforced even at the expense of causing one or more constraint violations with one or more objects other than the target object in some embodiments. In some embodiments, the method or system may comprise the respective process or module 624 of performing the modification process for the second set of one or more objects.

In some embodiments, the method or system may comprise the respective process or module 626 of determining whether or not the one or more relevant constraints are satisfied. In some embodiments, the method or system determines whether or not the one or more relevant constraints are satisfied during the performance of the creation or modification process to provide interactive or nearly real-time feedback to a user. In some embodiments, the method or system may comprise the respective process or module 628 of presenting or displaying results of 626 to a user via, for example, a user interface. More details about the process or module 626 and the process or module 628 are provided in the U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby expressly incorporated by reference in its entirety for all purposes.

System Architecture Overview

Figure 7:
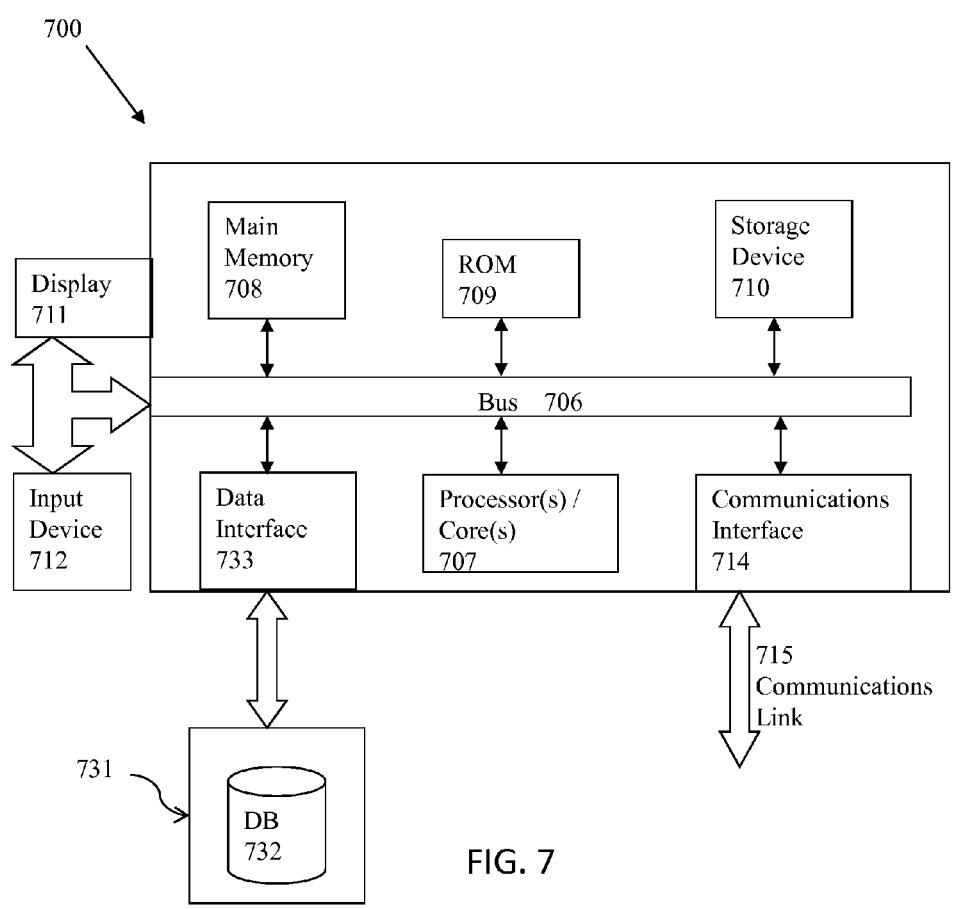
FIG. 7 illustrates a computerized system on which a method for implementing electronic designs with connectivity and constraint awareness may be implemented.

FIG. 7 illustrates a block diagram of an illustrative computing system 700 suitable for implementing some embodiments of the method or system for implementing electronic circuit designs with electro-migration awareness as described in the preceding paragraphs with reference to various figures. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

According to one embodiment, computer system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, i.e., application code, through communication link 715 and communication interface 714. Received program code may be executed by processor 707 as it is received, and/or stored in disk drive 710, or other non-volatile storage for later execution. In an embodiment, the computer system 700 operates in conjunction with a data storage system 731, e.g., a data storage system 731 that contains a database 732 that is readily accessible by the computer system 700. The computer system 700 communicates with the data storage system 731 through a data interface 733. A data interface 733, which is coupled to the bus 706, transmits and receives electrical, electromagnetic or optical signals that include data streams representing various types of signal information, e.g., instructions, messages and data. In embodiments of the invention, the functions of the data interface 733 may be performed by the communication interface 714.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic design with connectivity and constraint awareness, comprising:
   using at least one processor or at least one processor core to perform a process the process comprising:
   identifying a schematic design view of the electronic design;
   identifying or initiating a layout of the electronic design;
   identifying a relevant constraint for an object, which is subject to a modification process, in the layout from one or more sets of constraints; and
   determining whether the relevant constraint for the object is satisfied by using connectivity information that is associated with the object when the object is created in the physical design and is identified without requiring extraction for the object from the layout.

2. The computer implemented method of claim 1, the process further comprising:
   interactively presenting a result of whether the relevant constraint is satisfied.

3. The computer implemented method of claim 2, in which the result is interactively presented during a performance of the modification process on the object.

4. The computer implemented method of claim 1, in which the relevant constraint comprises a connectivity-based constraint that desires or requires the connectivity information to determine whether the relevant constraint is satisfied.

5. The computer implemented method of claim 1, in which the object comprises a net.

6. The computer implemented method of claim 1, in which the connectivity information includes data or information about a net to which the object belongs or about how the object is connected in the layout.

7. The computer implemented method of claim 1, in which the process further comprises:
   associating the schematic design view and the layout with a binder mapping process; and
   exchanging data or information between the schematic design view and the layout by using at least the binder mapping process.

8. The computer implemented method of claim 1, the process further comprising:
   associating the connectivity information with the object; and
   associating the relevant constraint or the one or more sets of constraints with the object.

9. The computer implemented method of claim 1, the process further comprising:
   identifying electrical data for the object; and
   using the electrical data to determine whether the relevant constraint is satisfied.

10. The computer implemented method of claim 1, the process further comprising:
    creating or identifying a net for the object by using the connectivity information;
    associating the net with at least one constraint of the one or more sets of constraints; and
    storing the net for the object as a programming object of a class.

11. The computer implemented method of claim 1, wherein the action of determining whether the relevant constraint is satisfied is performed during a performance of the modification process on the object.

12. The computer implemented method of claim 1, wherein the action of determining whether the relevant constraint is satisfied is performed without performing extraction on the layout or rebuilding a net to which the object belongs.

13. The computer implemented method of claim 1, wherein:
    the connectivity information is identified from a connectivity engine or is specified by a user, and
    the connectivity information provides information or data about a net to which the object belongs or about how the object is connected in the layout.

14. A computer implemented method for implementing an electronic design with connectivity and constraint awareness, comprising:
    using at least one processor or at least one processor core to perform a process the process comprising:
    identifying a first net, a second net, and connectivity information associated with the first net or with the second net when the object is created in a physical design for the electronic design;
    identifying a relevant constraint from one or more sets of constraints which are associated with the first net or the second net; and
    determining whether the relevant constraint is satisfied with the first net or the second net, wherein compliance or violation of the relevant constraint is determined based at least in part upon connectivity information that is identified without requiring extraction for the first net or the second net from the electronic design.

15. The computer implemented method of claim 14, wherein the first net or the second net comprises a partial, incomplete net.

16. The computer implemented method of claim 14, wherein the relevant constraint imposes one or more requirements on both the first net and the second net.

17. The computer implemented method of claim 14, the process further comprising:
    identifying a schematic design session including a schematic design view of the electronic design;
    identifying a physical design session including a layout of the electronic design; and
    associating the schematic design session with the physical design session with a binder mapping.

18. The computer implemented method of claim 17, the process further comprising:

identifying electrical data or information from the schematic design session by using the binder mapping; and passing a form of the electrical data or information to the physical design session, wherein the form of the electrical data or information is used to determine whether the relevant constraint is satisfied.

19. The computer implemented method of claim 14, the process further comprising:

identifying one or more first objects in the first net into a first set of objects;

performing object merging on the first set of objects to form a first merged object; and determining a first geometric characteristic of the first merged object.

20. The computer implemented method of claim 19, the process further comprising:

identifying one or more second objects in the second net into a second set of objects;

performing the object merging on the second set of objects to form a second merged object; and determining a second geometric characteristic of the second merged object.

21. The computer implemented method of claim 20, the process further comprising:

performing a modification process on the first set of objects; and using at least the first geometric characteristic or the second geometric characteristic to determine the compliance or violation of the relevant constraint.

22. The computer implemented method of claim 20, wherein:

the first geometric characteristic corresponds to a first external boundary or a first bounding box of the first merged object, in which the first bounding box is determined based at least in part upon a first value of the relevant constraint, and the second geometric characteristic corresponds to a second external boundary or a second bounding box of the second merged object, in which the second bounding box is determined based at least in part upon a second value of the relevant constraint or another constraint.

23. A system for implementing an electronic design with connectivity and constraint awareness, comprising:

at least one processor or at least one processor core that is to:

identify a schematic design view of the electronic design;

identify or initiate a layout of the electronic design;

identify a relevant constraint for an object, which is subject to a modification process, in the layout from one or more sets of constraints; and determine whether the relevant constraint is satisfied with the object by using connectivity information that is associated with the object when the object is created in the physical design and is identified without requiring extraction for the object from the layout.

24. The system of claim 23, in which the at least one processor or the at least one processor core is further to:

associate the schematic design view and the layout with a binder mapping process; and exchange data or information between the schematic design view and the layout by using at least the binder mapping process.

25. The system of claim 23, in which the at least one processor or the at least one processor core is further to:

associate the connectivity information with the object; and associate the relevant constraint or the one or more sets of constraints with the object.

26. The system of claim 23, in which the at least one processor or the at least one processor core is further to:

identify electrical data for the object; and use the electrical data to determine whether the relevant constraint is satisfied.

27. The system of claim 23, in which the at least one processor or the at least one processor core is further to:

create or identify a net for the object by using the connectivity information;

associate the net with at least one constraint of the one or more sets of constraints; and store the net for the object as a programming object of a class.

28. A system for implementing an electronic design with connectivity and constraint awareness, comprising:

at least one processor or at least one processor core that is to:

identify a first net, a second, and connectivity information associated with the first net or with the second net when the first net or the second net is created in a physical design for the electronic design;

identify a relevant constraint from one or more sets of constraints which are associated with the first net or the second net; and determine whether the relevant constraint is satisfied with the first net or the second net, wherein compliance or violation of the relevant constraint is determined based at least in part upon connectivity information that is identified without requiring extraction for the first net or the second net from the electronic design.

29. The system of claim 28, in which the at least one processor or the at least one processor core is further to:

identify a schematic design session including a schematic design view of the electronic design;

identify a physical design session including a layout of the electronic design; and associate the schematic design session with the physical design session with a binder mapping.

30. The system of claim 29, in which the at least one processor or the at least one processor core is further to:

identify electrical data or information from the schematic design session by using the binder mapping; and pass a form of the electrical data or information to the physical design session, wherein the form of the electrical data or information is used to determine whether the relevant constraint is satisfied.

31. The system of claim 28, in which the at least one processor or the at least one processor core is further to:

identify one or more first objects in the first net into a first set of objects;

perform object merging on the first set of objects to form a first merged object; and determine a first geometric characteristic of the first merged object.

32. The system of claim 31, in which the at least one processor or the at least one processor core is further to:

identify one or more second objects in the second net into a second set of objects;

perform the object merging on the second set of objects to form a second merged object; and determine a second geometric characteristic of the second merged object.

33. An article of manufacture comprising a non-transitory computer readable storage medium having a sequence of instructions stored thereupon which, when executed by at least one processor or at least one processor core, causes the at least one processor or the at least one processor core to perform a method for implementing an electronic design with connectivity and constraint awareness, the method comprising:

using at least one processor or at least one processor core to perform a process, the process comprising:

identifying a schematic design view of the electronic design;

identifying or initiating a layout of the electronic design;

identifying a relevant constraint for an object, which is subject to a modification process, in the layout from one or more sets of constraints; and determining whether the relevant constraint is satisfied with the object by using connectivity information that is associated with the object when the object is created in the physical design and is identified without requiring extraction for the object from the layout.

34. The article of manufacture of claim 33, the process further comprising:

associating the schematic design view and the layout with a binder mapping process; and exchanging data or information between the schematic design view and the layout by using at least the binder mapping process.

35. The article of manufacture of claim 33, the process further comprising:

associating the connectivity information with the object; and associating the relevant constraint or the one or more sets of constraints with the object.

36. The article of manufacture of claim 33, the process further comprising:

identifying electrical data for the object; and using the electrical data to determine whether the relevant constraint is satisfied.

37. The article of manufacture of claim 33, the process further comprising:

creating or identify a net for the object by using the connectivity information;

associating the net with at least one constraint of the one or more sets of constraints; and storing the net for the object as a programming object of a class.

38. An article of manufacture comprising a non-transitory computer readable storage medium having a sequence of instructions stored thereupon which, when executed by at least one processor or at least one processor core, causes the at least one processor or the at least one processor core to perform a method for implementing an electronic design with connectivity and constraint awareness, the method comprising:

using at least one processor or at least one processor core to perform a process, the process comprising:

identifying a first net, a second, and connectivity information associated with the first net or with the second net when the first net or the second net is created in a physical design for the electronic design;

identifying a relevant constraint from one or more sets of constraints which are associated with the first net or the second net; and determining whether the relevant constraint is satisfied with the first net or the second net, wherein compliance or violation of the relevant constraint is determined based at least in part upon connectivity information that is identified without requiring extraction for the first net or the second net from the electronic design.

39. The article of manufacture of claim 38, the process further comprising:

identifying a schematic design session including a schematic design view of the electronic design;

identifying a physical design session including a layout of the electronic design; and associating the schematic design session with the physical design session with a binder mapping.

40. The article of manufacture of claim 39, the process further comprising:

identifying electrical data or information from the schematic design session by using the binder mapping; and passing a form of the electrical data or information to the physical design session, wherein the form of the electrical data or information is used to determine whether the relevant constraint is satisfied.

41. The article of manufacture of claim 38, the process further comprising:

identifying one or more first objects in the first net into a first set of objects;

performing object merging on the first set of objects to form a first merged object; and determining a first geometric characteristic of the first merged object.

42. The article of manufacture of claim 41, the process further comprising:

identifying one or more second objects in the second net into a second set of objects;

performing the object merging on the second set of objects to form a second merged object; and determining a second geometric characteristic of the second merged object.

* * * * *